United States Patent
Shichi et al.

[11] Patent Number: 5,612,582
[45] Date of Patent: Mar. 18, 1997

[54] SWITCHING DEVICE

[75] Inventors: Makoto Shichi; Mamabu Hayakawa, both of Kariya, Japan; Dennis M. Wright, Eastlake, Ohio

[73] Assignee: Allen-Bradley Company, Inc., Milwaukee, Wis.

[21] Appl. No.: 582,834

[22] Filed: Jan. 2, 1996

[51] Int. Cl.$^6$ ........................................................ H01H 7/00
[52] U.S. Cl. .................. 307/130; 307/125; 307/139; 307/141; 327/143; 327/261; 327/381; 363/74; 323/234
[58] Field of Search ........................... 307/130, 125, 307/116, 139, 141; 327/261, 143, 381; 363/74; 323/234; 301/94, 93

[56]  References Cited

U.S. PATENT DOCUMENTS

| | | | |
|---|---|---|---|
| 4,041,334 | 8/1977 | Umeda | 327/143 |
| 4,307,440 | 12/1981 | Inoue et al. | 363/15 |
| 5,184,031 | 2/1993 | Hayakawa et al. | 327/544 |
| 5,204,562 | 4/1993 | Pace | 327/381 |
| 5,469,094 | 11/1995 | Nessi | 327/110 |

*Primary Examiner*—David S. Martin
*Assistant Examiner*—Albert W. Paladini
*Attorney, Agent, or Firm*—John M. Miller; John J. Horn

[57]  ABSTRACT

The present invention provides a switching device incorporating a simple circuit capable of avoiding the flash-on of a transistor when a power supply is turned on and off thereby reducing the OFF delay time. The output circuit comprises a FET (145) having a drain and a source connected in series to a current line for supplying a current from a power supply (VD) to an output detector (load) (L), and a photocoupler (149) for applying a driving voltage across the gate and the source of the FET (145) according to the output of an internal circuit (151), a differentiation circuit comprising a capacitor (7) and resistors (5,9) is connected across the drain and the source of the FET (145), and second transistor (3) having a collector and an emitter connected to the gate and the soruce of the FET (145) is driven by a charging current for charging the capacitor (7). When a voltage applied across the drain and the source of the FET (145) starts rising, the second transistor (3) is turned on to turn off the FET (145) forcibly.

5 Claims, 6 Drawing Sheets

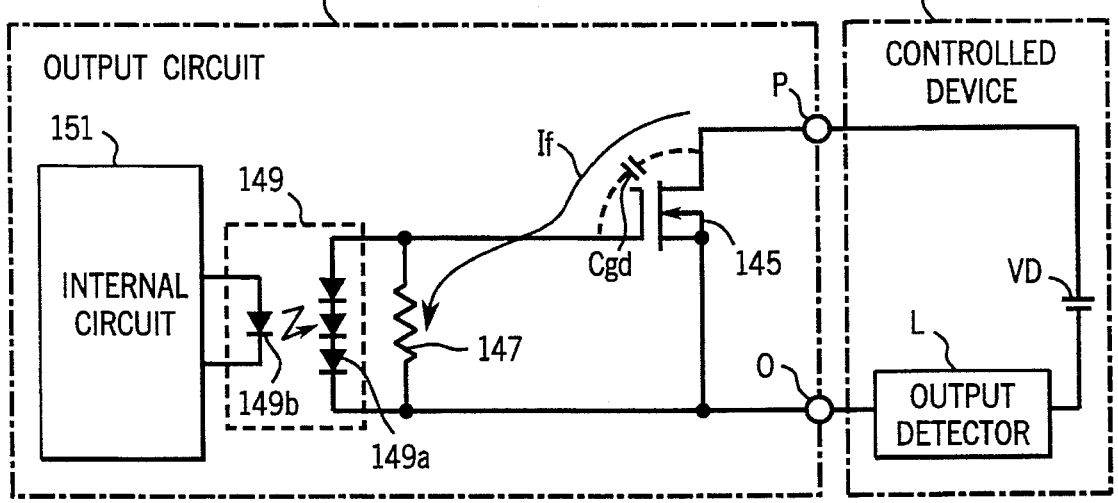
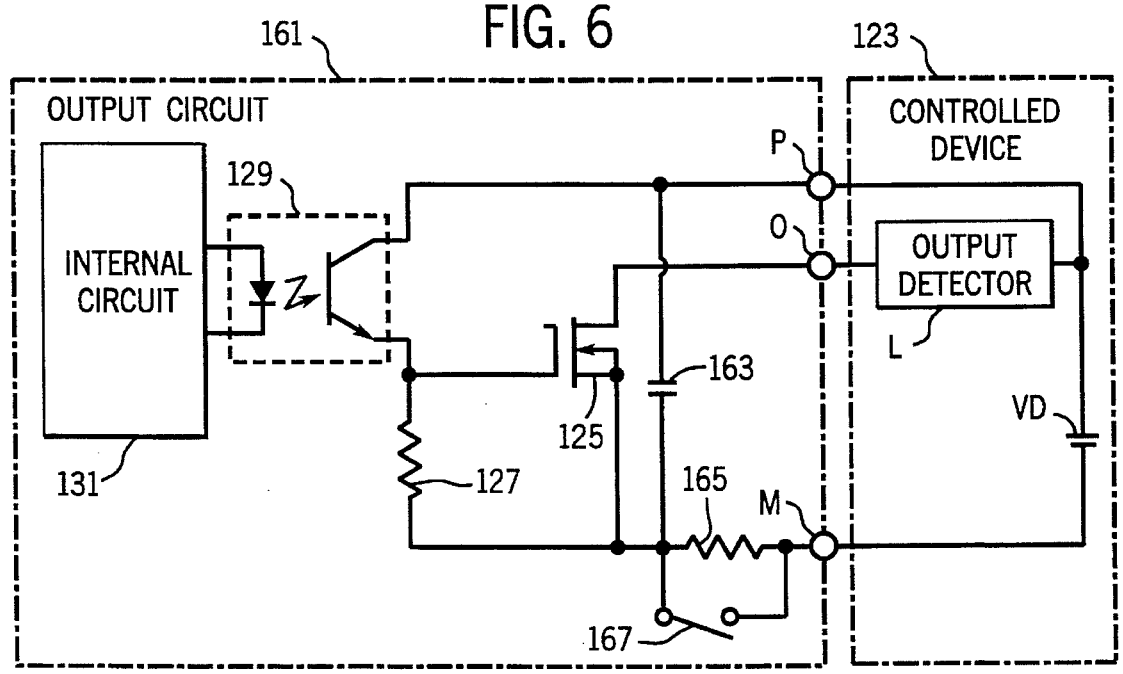

5,612,582

SWITCHING DEVICE

FIELD OF INVENTION

The present invention relates to a switching device employing a transistor to connect and disconnect a current line for supplying a current from a power supply to a load.

BACKGROUND OF INVENTION

Conventional switching devices are used in output circuits as shown in FIGS. 5(A), 5(B) and 5(C) for giving control signals to a controlled device included in a programmable controller. In particular, the output circuits shown in FIGS. 5(A), 5(B) and 5(C) employ FETs as output transistors. Referring to FIG. 5(A), an output circuit 101 is of the so-called "source output" type connected to a controlled device 103 having a power supply VD, and an output detector L, i.e., a load, having a first terminal connected to the negative terminal of the power supply VD. The three terminals P, O and M of the output circuit 101 are connected to the positive terminal of the power supply VD, a second terminal of the output detector L, and the negative terminal of the power supply VD, respectively. The output circuit 101 in part comprises a p-channel FET 105 having a source connected through the terminal P to the positive terminal of the power supply VD, and a drain connected through the terminal O to the second terminal of the output detector L. The output circuit 101 further comprises a resistor 107 connected across the source and the gate of the FET 105 to pull up the gate of the FET 105 to the positive terminal of the power supply VD, a photocoupler 109 comprising a phototransistor 109a having a collector connected to the gate of the FET 105 and an emitter connected through the terminal M to the negative terminal of the power supply VD. Additionally, output circuit 101 comprises and an LED 109b that emits light to drive the phototransistor 109a, and an internal circuit 111 comprising a microcomputer or the like to drive the LED 109b of the photocoupler 109 according to a control signal.

In the source output type output circuit 101, a current is supplied from the voltage supply VD through the resistor 107 to the phototransistor 109a of the photocoupler 109. When the internal circuit 111 drives the LED 109b of the photocoupler 109 for light emission a potential difference is induced between the gate and the source of the FET 105 and the FET 105 is turned on. Then, a current is supplied from the power supply VD through the source and the drain of the FET 105 to the output detector L and the controlled device 103 detects the flow of the current through the output detector L to detect the result of control operation of the internal circuit 111.

Referring to FIG. 5(B), an output circuit 121 is of the so-called "sink output" type connected to a controlled device 123 having a power supply VD, and an output detector L having a first terminal connected to the positive terminal of the power supply VD. The three terminals P, O and M of the output circuit 121 are connected to the positive terminal of the power supply VD, a second terminal of the output detector L, and the negative terminal of the power supply VD, respectively. The output circuit 121 in part comprises an n-channel FET 125 having a source connected through the terminal M to the negative terminal of the power supply VD, and a drain connected through the terminal O to the second terminal of the output detector L. The output circuit 121 further comprises a resistor 127 connected across the source and the gate of the FET 125 to pull down the gate of the FET 125 to the positive terminal of the power supply VD, a photocoupler 129 comprising a phototransistor 129a having a collector connected through the terminal P to the positive terminal of the power supply VD and an emitter connected to the gate of the FET 125. Additionally, out put circuit 121 comprises an LED 129b that emits light to drive the phototransistor 129a, and an internal circuit 131 to drive the LED 129b of the photocoupler 129 according to the results of control.

In the sink output type output circuit 121, a current is supplied from the voltage supply VD through the phototransistor 129a of the photocoupler 129 to the resistor 127 when the internal circuit 131 drives the LED 129b of the photocoupler 129 for light emission. Consequently, a potential difference is induced between the gate and the source of the FET 125 and the FET 125 is turned on. Then, a current is supplied from the power supply VD through the drain and the source of the FET 125 to the output detector L and the controlled device 123 detects the flow of the current through the output detector L to detect the result of control operation of the internal circuit 131.

The source output type output circuit 101 switches the current line connecting the power supply VD to the output detector L on the positive side (high side) of the output detector L, the sink output type output circuit 121 switches the current line connecting the power supply VD to the output detector L on the negative side (low side) of the output detector L.

An output circuit 141 shown in FIG. 5(C) is of the so-called "independent output" type capable of being used in either the "source output" type or the "sink output" type. In the configuration shown in FIG. 5(C), the output circuit 141 is in a source output type, in which an output detector L in controlled device 143 is on the negative side of power supply VD. The output circuit 141 is connected through two terminals P and O to the positive terminal of the power supply VD and a second terminal of the output detector L, respectively. The output circuit 141 comprises in part a n-channel FET 145 having a drain connected through the terminal P to the positive terminal of the power supply VD and a source connected through the terminal O to the second terminal of the output detector L. Output circuit 141 further comprises a resistor 147 connected across the gate and the source of the FET 145, a photovoltaic coupler 149 comprising a photodiode array 149a connected in forward connection in the direction from the gate to the source of the FET 145 and in parallel to the resistor 147. Additionally, circuit 141 comprises an LED 149b that emits light to make the photodiode array 149a generate an electromotive force, and an internal circuit 151 that drives the LED 149b of the photovoltaic coupler 149 for light emission according to the result of control.

In this independent type output circuit 141, the photodiode array 149a generates voltage when the internal circuit 151 drives the LED 149b of the photovoltaic coupler 149 for light emission and, consequently, a potential difference is induced between the gate and the source of the FET 145 to turn on the FET 145. Then, a current is supplied from the power supply VD through the drain and the source of the FET 145 to the output detector L, the controlled device 143 detects the flow of a current through the output detector L to detect the result of control operation of the internal circuit 151.

In output circuits 101, 121 and 141, the FETs 105, 125 and 145 are turned on instantaneously and an erroneous output is provided when the controlled devices 103, 123 and 143 are connected with the power supplies VD turned on or when the power sources VD are turned on and the controlled devices 103, 123 and 143 are connected. Consequently, the controlled devices 103, 123 and 143 malfunction. Specifically, trouble occurs because a current If is supplied through the resistors 107, 127 and 147 to the junction capacitances Cgd between the gate and the source of each of the FETs 105, 125 and 145 as shown in FIG. 5. As a result, a potential difference is induced between the gate and the source of each of the FETs 105, 125 and 145, and the so-called flash-on occurs when a voltage that increases sharply is applied across the drain and the source of each of the FETs 105, 125 and 145.

Since the driving ability of the photovoltaic coupler 149 of the independent output type output circuit 141 as shown in FIG. 5(C) is as minute as several tens of microamperes, the resistance of the resistor 147 connected across the gate and the source of the FET 145 must be several hundreds kilo-ohms or above. Therefore, a voltage is generated across the gate and the source of the FET 145 by a slight current and, since the discharge time of the junction capacitance Cgs between the gate and the source is comparatively long, striking flash-on inevitably occurs.

A technique proposed to prevent such flash-on is disclosed in JP-A No. 5-37322 and will be explained in connection with the "sink output" type output circuit shown in FIG. 5(B). For example, in FIG. 6 an output circuit 161 incorporating this prior art technique, is shown. In particular, a capacitor 163 is connected across a terminal P to the positive terminal of a power supply VD and the source of a FET 125. Additionally, a resistor 165 is connected across the junction point between the source of the FET 125 and the capacitor 163, and a terminal M connected to the negative terminal of the power supply VD, and a bypass circuit 167 for bypassing the resistor 165 when the terminal voltage of the capacitor 163 exceeds a predetermined level.

In this output circuit 161, the capacitor 163 is not charged immediately after the connection of a controlled device 123 or the connection of the power supply VD, and hence the potential of the source of the FET 125 is equal to that of the positive terminal of the power supply VD. Then, the capacitor 163 is charged through the resistor 165 with time and the voltage on the side of the source of the FET 125 decreases gradually. Upon the increase of the terminal voltage of the capacitor 163 beyond a predetermined level, the bypass circuit 167 closes to omit the resistor 165 from the line connecting the source of the FET 125 and the negative terminal of the power supply VD. Accordingly, the source-drain voltage of the FET 125 increases gradually when the supply voltage of the power supply VD is applied to the output circuit 161, which prevents the flash-on of the FET 125, i.e., the instantaneous closing of the FET 125.

However, prior art output circuit 161 requires bypass circuit 167 to bypass the resistor 165 inserted in the current line, and generally the bypass circuit 167 is comprised of a relay or a transistor. Alternatively, when the bypass circuit 167 is comprised of a relay, the relay increases the size of the device. When the bypass circuit 167 is comprised of a transistor, the current capacity of the transistor must be equal to or greater than that of the output transistor, i.e., the FET 125, which inevitably increases the size of the device when the resistance of the output detector L, i.e., the load, is small or the supply voltage of the power supply VD is high and a high current flows through the bypass circuit 167.

Those known output circuits 101, 121, 141 and 161 are problematic in that the time necessary to turn off the FETs 105, 125 and 145, i.e., off delay time, is comparatively long. The off delay time is described below with reference to FIG. 7 in connection with the independent output type output circuit shown in FIG. 5(C). In particular, when turning OFF the FET 145 in the ON state, the internal circuit 151 stops the light emitting operation of the LED 149b to stop voltage generation by the photodiode array 149a. Then, as indicated by the two arrows in FIG. 7(A), the gate-source junction capacitance Cgs and the gate-drain junction capacitance Cgd of the FET 145 are discharged through the resistor 147. Subsequently, the gate-source voltage of the FET 145 drops to a predetermined OFF voltage and the drain-source voltage of the FET 145 starts increasing, i.e., the FET 145 starts changing from the ON state to the OFF state. At the same time, a current flows through the resistor 147 to the gate-drain junction capacitance Cgd as indicated by the arrow shown in FIG. 7(B) due to the rise of the drain-source voltage to impede the discharge of the gate-source junction capacitance Cgs. Thus, the OFF delay time is the sum of time T1 in which the junction capacitance Cgs and Cgd of the FET 145 are discharged and the gate-source voltage of the FET 145 drops to the predetermined OFF voltage, and time T2 in which the discharge of the junction capacitance Cgs is impeded by the charging of the gate-source junction capacitance Cgd by the rising drain-source voltage of the FET 145. As a result, this known output circuit cannot reduce the OFF delay time and, consequently, is incapable of rapid switching operation. Furthermore, an output circuit employing a bipolar transistor or an IGBT having both the characteristics of a bipolar transistor and a FET instead of a FET has the same problems.

In view of the foregoing, there is a present need for a switching device of a simple configuration capable of preventing flash-on. Additionally, there is a present need for a switching device capable of reducing the OFF delay time.

SUMMARY OF THE INVENTION

The invention provides a switching device comprising: a transistor having a collector and an emitter, or a drain and a source connected, respectively, to two output terminals connected in series to a current line for supplying a current from a power supply to a predetermined load; and a drive control apparatus for controlling the switching operation of the transistor by supplying a current or applying a voltage to a driving terminal connected to the base or the gate of the transistor to control the supply of current to the load; characterized by: a voltage application detecting apparatus for detecting whether the supply voltage of the power supply is applied through the load across the two output terminals of the transistor; and a voltage control apparatus for forcibly holding for a predetermined time the voltage applied to the driving terminal on a voltage level at which the transistor is turned off when the voltage application detecting apparatus detects the application of the supply voltage of the power supply across the two output terminals of the transistor.

The drive control apparatus receives the supply voltage of the power supply to drive the transistor for switching operation, the voltage application detecting apparatus decides that the supply voltage is applied to the two output terminals of the transistor upon the detection of the leading edge of a voltage applied to the drive control apparatus.

The voltage application detecting apparatus decides that the supply voltage is applied across the two output terminals of the transistor upon the detection of the leading edge of the supply voltage applied across the two output terminals of the transistor.

The voltage application detecting apparatus is a differentiation circuit comprising a capacitor and resistors connected in series to the capacitor, and the voltage control apparatus is a second transistor that connects the driving terminal of the transistor to the output terminal connected to the emitter or the source when a charging current for charging the capacitor is equal to or higher than a predetermined level.

In the switching device, the two terminals connected to the collector and the emitter, or the drain and the source of the transistor, respectively, are connected in series to a current line for supplying a current from the power supply to the predetermined load; and the drive control apparatus controls the switching operation of the transistor by supplying a current or applying a voltage to the driving terminal connected to the base or the gate of the transistor to control the supply of current to the load.

The voltage application detecting apparatus detects whether the supply voltage of the power supply is applied through the load across the two output terminals of the transistor; and the voltage control means forcibly holds for a predetermined time the voltage applied to the driving terminal on a voltage level at which the transistor is turned off when the voltage application detecting apparatus detects the application of the supply voltage of the power supply across the two output terminals of the transistor.

The switching device holds the voltage of the driving terminal (the base or the gate) of the transistor forcibly at the voltage level which the transistor is turned off, instead of moderating the variation of the voltage applied across the output terminals of the transistor in the known device illustrated in FIG. 6, so as to not turn on the transistor. Additionally, the switching device is able to prevent flash-on without requiring any additional parts on the current line connecting the output terminals, the power supply and the load. Thus, the switching device can be formed in a comparatively small size and has enhanced reliability.

The switching device stated in claim 2 is based on the configurations shown in FIGS. 5(A) and 5(B), and the voltage application detecting apparatus decides that the supply voltage is applied through the load to the two output terminals of the transistor upon the detection of the leading edge of the supply voltage of the power supply. The drive control apparatus corresponds to the resistor 107 and the photocoupler 109, and the resistor 127 and the photocoupler 129 shown in FIGS. 5(A) and 5(B).

In accordance with the present invention when the power supply is turned on and voltage that increases sharply is applied across the output terminals of the transistor, the voltage control apparatus holds forcibly for a predetermined time the voltage level at which the transistor is turned off thereby preventing flash-on.

In the switching device, if high-frequency noise is superposed on the supply voltage of the power supply, the voltage application detecting apparatus detects the leading edge of the supply voltage of the power supply and the voltage control apparatus turns off the transistor forcibly. Consequently, flash-on due to the application of a sharply increasing voltage including the high-frequency noise superposed on the supply voltage of the power supply across the output terminals of the transistor can be prevented.

The voltage application detecting apparatus decides that the supply voltage is applied across the two output terminals of the transistor upon the detection of the leading edge of the supply voltage applied across the two output terminals of the transistor.

The switching device is able to prevent flash-on even if a sharply increasing voltage is applied only across the output terminals of the transistor. Since the switching device detects the leading edge of the supply voltage, there is the possibility that flash-on occurs only when the voltage applied across the output terminals of the transistor rises while the supply voltage of the power supply is stable. In the switching device, since the leading edge of the voltage applied across the output terminals of the transistor is detected directly, the voltage control apparatus functions effectively to deal with the leading edges of any voltages applied across the output terminals of the transistor, such as the supply voltage varying immediately after the connection of the power supply and the supply voltage including high-frequency noise. Accordingly, the switching device is capable of preventing flash-on in all cases.

The switching device reduces the OFF delay time of the transistor. As mentioned above, delay in turning off the transistor is due to a phenomenon similar to flash-on and caused by variation in the leading edge of the voltage applied across the terminals of the transistor due to increase in the potential difference between the output terminals when the transistor in the ON state and changing to the OFF state.

As mentioned above, the voltage control apparatus of the switching device functions to deal with the rise of all kinds of voltages applied across the output terminals of the transistor. Therefore, the voltage application detecting apparatus detects variation in the rise of the voltage applied across the output terminals after the transistor in the ON state has started changing to the OFF state, and the voltage control apparatus forcibly turns off the transistor. Thus, the time T2 explained above is reduced and, consequently, the transistor can be turned off quickly. Accordingly, since the switching device reduces the OFF delay time, a rapid switching operation is possible and the time in which the transistor is linearly in the ON state (the time T2) can be reduced and hence the switching loss due to the transistor can be reduced.

The voltage application detecting apparatus is a differentiation circuit comprising a capacitor and resistors connected in series to the capacitor, and the voltage control apparatus is a second transistor that connects the driving terminal of the transistor to the output terminal connected to the emitter or the source when a charging current for charging the capacitor is equal to or higher than a predetermined level.

According to an invention, the differentiation circuit comprising the capacitor and the resistors is connected across the power supply in the switching device, and the differentiation circuit is connected across the output terminals of the transistor in the switching device.

When the voltage applied across the power supply or the output terminals of the transistor starts rising, the capacitor of the differentiation circuit is charged at a predetermined time constant dependent on the resistor. Therefore, in the switching device, the second transistor connects the driving terminal of the output transistor to the emitter or the source to turn off the output transistor forcibly when charging current for charging the capacitor is equal to or higher than a predetermined level. Thus, the switching device has a simple configuration and is capable of detecting the leading edge of the voltage and of forcibly turning off the output transistor.

BRIEF DESCRIPTION OF THE DRAWINGS

FIG. 5 is a circuit diagram of techniques on which the present invention is based and is of assistance in explaining flash-on.

FIG. 6 is a circuit diagram of assistance in explaining a conventional device.

DETAILED DESCRIPTION OF THE PREFERRED EMBODIMENT

Figure 1:
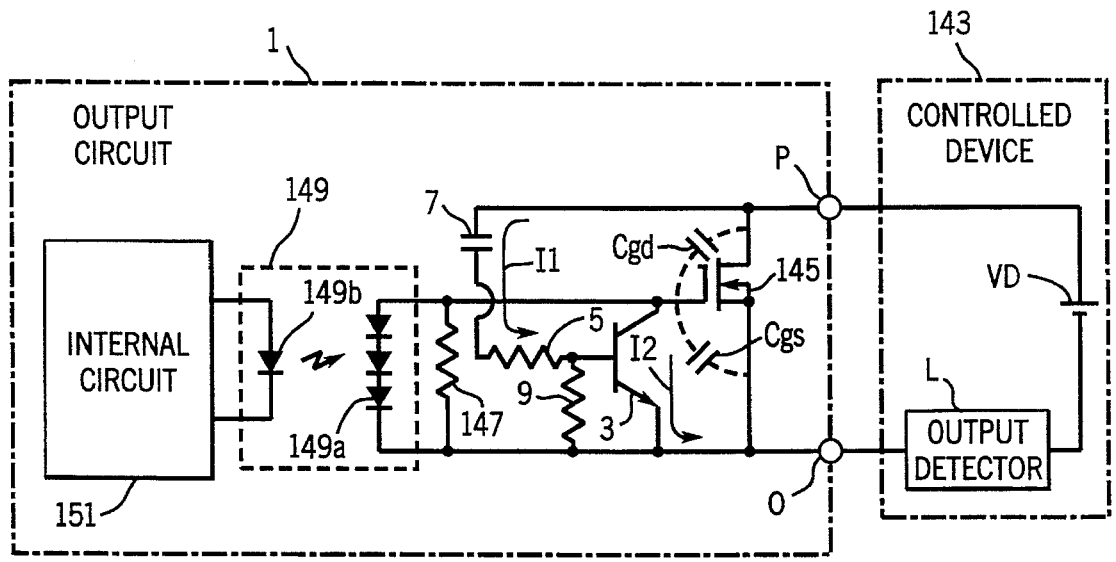
FIG. 1 is a circuit diagram of an output device in a first embodiment according to the present invention.

Preferred embodiments of the present invention will be described hereinafter with reference to the accompanying drawings. In particular, FIG. 1 is a circuit diagram of an output circuit 1 included in a programmable controller in a first embodiment according to the present invention, in which parts like or corresponding to those shown in FIG. 5(C) are designated by the same reference characters. This output circuit 1 is an application of the present invention to the prior art "independent output" type output circuit 141 shown in FIG. 5(C). Since the basic configuration and the operations of the output circuit 1 are the same as those of the output circuit 141 shown in FIG. 5(C), the description thereof will be omitted and only the configuration and the functions of the output circuit 1 different from those of the output circuit 141 shown in FIG. 5(C) will be described.

Referring to FIG. 1, the output circuit 1 in the first embodiment comprises, in addition to the components of the output circuit 141 shown in FIG. 5(C), an npn transistor 3 (hereinafter referred to as "second transistor 3") having a collector connected to the gate of the FET 145, and an emitter connected to the source of the FET 145, a resistor 5 having one end connected to the base of the second transistor 3, a capacitor 7 having one terminal connected to the other end of the resistor 5 and the other terminal connected to the drain of the FET 145, and a resistor 9 connected across the base and the emitter of the second transistor 3.

In the output circuit 1 in the first embodiment, the photovoltaic coupler 149 and the resistor 147 correspond to the drive control means. The differentiation circuit comprising the capacitor 7 and the resistors 5 and 9 corresponds to the voltage application detecting means, and the second transistor 3 corresponds to the voltage control means.

When the controlled device 143 is connected with the power supply VD turned on or when the power supply VD is turned on with the controlled device 143 connected, a sharply rising voltage is applied across the drain and the source of the FET 145. Then, as shown in FIG. 5(C), a charging current flows from the drain to the gate to charge the gate-drain junction capacitance Cgd and, at the same time, a current I1 flows through the differentiation circuit comprising the capacitor 7 and the resistors 5 and 9, and the current I1, i.e., a charging current for charging the capacitor 7, acts as part of a base current that turns on the second transistor 3. Therefore, the; current that flows through the gate-drain junction capacitance Cgd does not flow through the resistor 147 but flows as the collector-emitter current I2 of the transistor 3 directly to the source of the FET 145, which prevents the creation of a potential difference between the gate and the source of the FET 145.

The charging current I1 decreases as the capacitor 7 is charged. Upon the decrease of the charging current I1 below a predetermined level, the second transistor 3 is turned off. The junction capacitance Cgd of the FET 145 is charged to its full capacity before the second transistor 3 is turned off and no more current flows. Thus, the output circuit 1 prevents the instantaneous turning on of the FET 145, i.e., flash-on, when the power supply is turned on merely by the second transistor 3, the capacitor 7 and the resistors 5 and 9. The additional second transistor 3 may be of a small current capacity regardless of the intensity of the current supplied to the output detector L. The output circuit performs the similar operation to avoid malfunction when a sharply rising voltage including high-frequency noise is applied across the drain and the source of the FET 145.

Figure 7A:
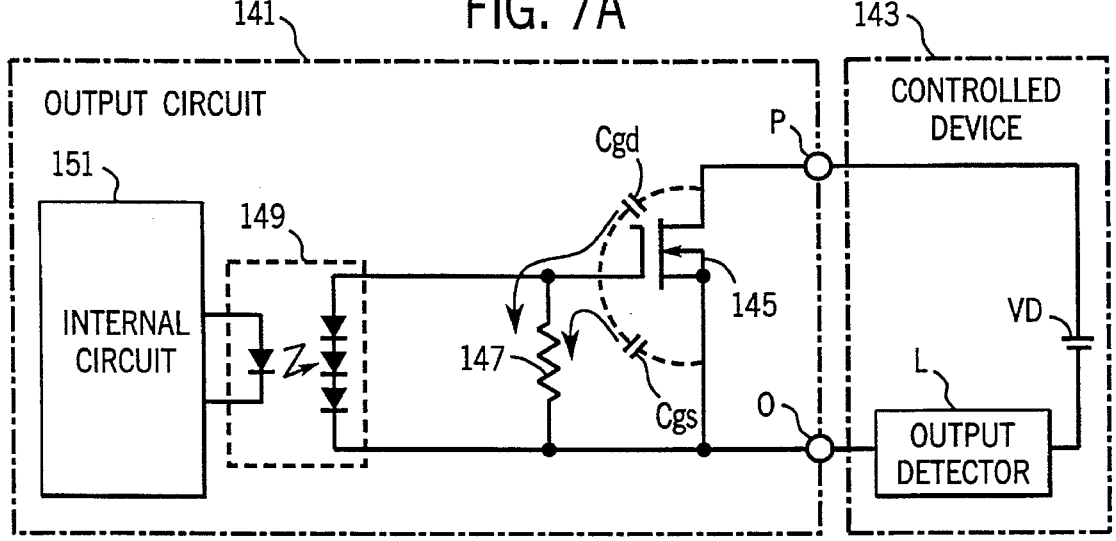
FIG. 7 is a circuit diagram of assistance in explaining the OFF delay time of a transistor.
Figure 7B:
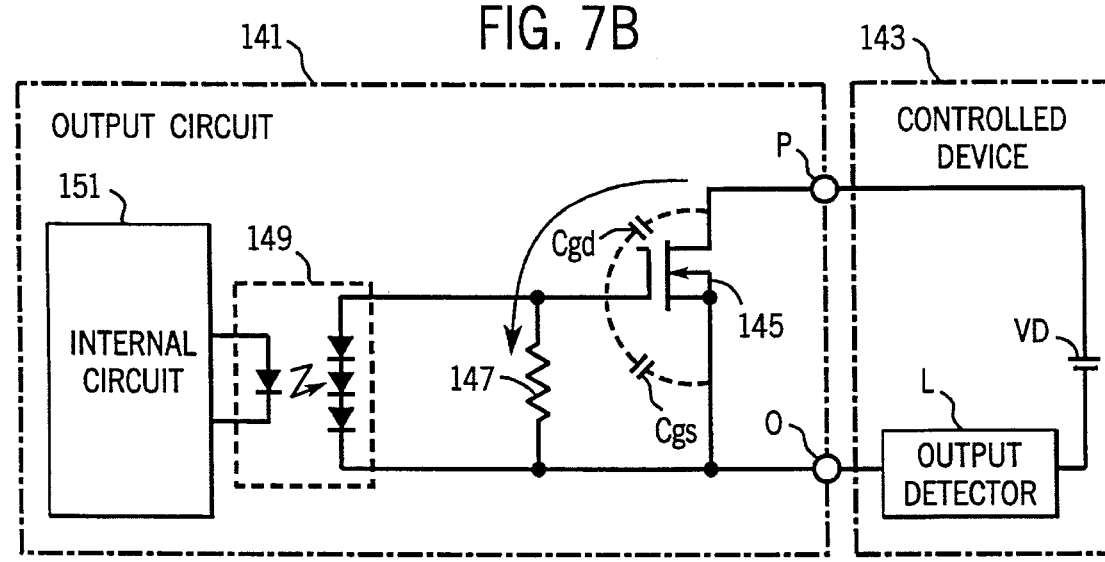

The operation of turning the FET 145 from the ON state to OFF when the output circuit 1 operating normally is described below. Specifically, the internal circuit 151 stops the light emitting operation of the LED 149b to stop the voltage generating operation of the photodiode array 149a. Then, the gate-source junction capacitance Cgs and the gate-drain junction capacitance Cgd of the FET 145 are discharged through the resistor 147 as shown in FIG. 7. Upon the drop of the gate-source voltage of the FET 145 to a predetermined OFF voltage, the FET 145 in the ON state starts changing to the OFF state, and then the drain-source voltage rises. Then, as mentioned above, a charging current flows to the gate-drain junction capacitance Cgd from the drain to the gate. At the same time, the current I1 flows through the differentiation circuit comprising the capacitor 7 and the resistors 5 and 9, and the second transistor 3 is turned on by the current I1. Therefore, the current that flows through the gate-drain junction capacitance Cgd does not flow through the resistor 147 but flows as a collector-emitter current I2 to the source of the FET 145, and the charge stored in the gate-source junction capacitance Cgs is charged rapidly through the second transistor 3, so that the FET 145 is turned off instantaneously. As the capacitor 7 is charged and the current I1 decreases below a predetermined level, the second transistor 3 is turned off. By this time, the junction capacitance Cgd of the FET 145 has fully charged and the junction capacitance Cgs has been fully discharged.

In the output circuit 1 in the first embodiment, the gate-drain junction capacitance Cgd is charged and the time T2 in which the discharge of the junction capacitance Cgs is impeded and reduced when the FET 145 is turned off, so that the OFF delay time of the FET 145 is reduced. Thus, the output circuit 1 in the first embodiment avoids the flash-on of the FET 145 by the simple circuit and further reduces the OFF delay time. Consequently, the speed of the switching operation of the FET 145 can be enhanced and the time in which the FET 145 is linearly in the ON state, i.e., the time T2, can be reduced, which reduces the switching loss of the FET 145.

Figure 2:
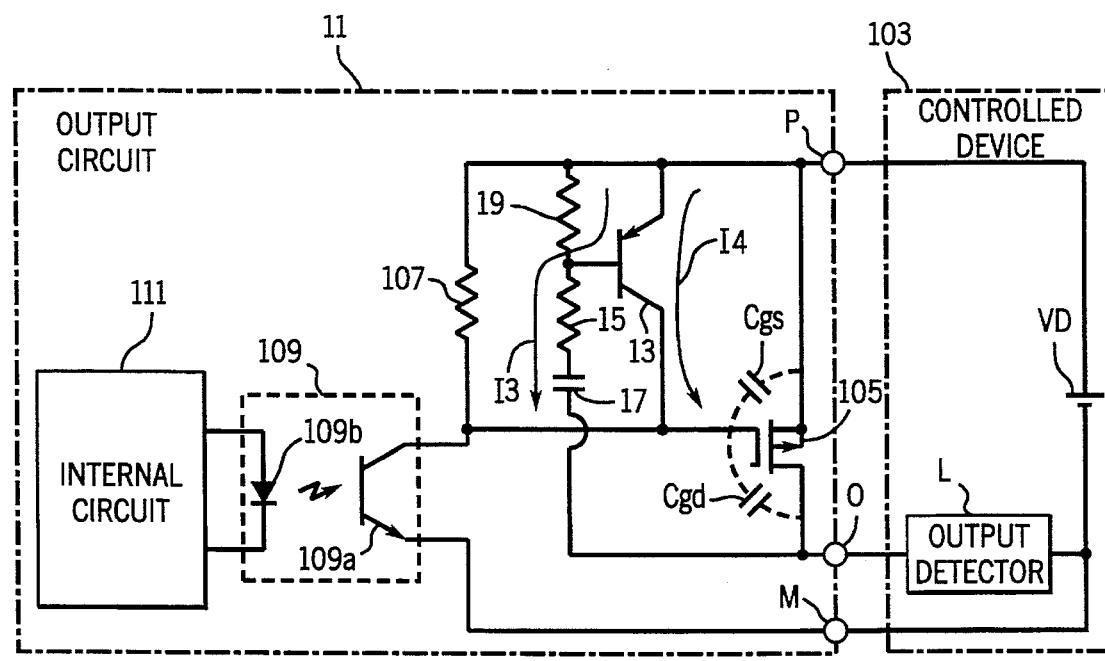
FIG. 2 is a circuit diagram of an output device in a second embodiment according to the present invention.
Figure 5A:
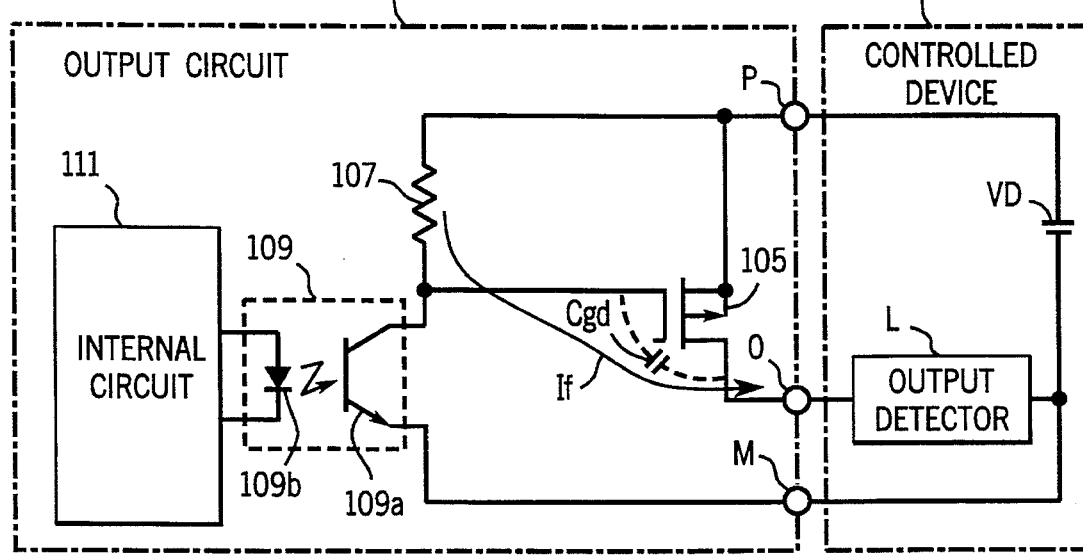

FIG. 2 is a circuit diagram of an output circuit 11 included in a programmable controller in a second embodiment according to the present invention,.in which parts like or corresponding to those shown in FIG. 5(A) are designated by the same reference characters. This output circuit 11 is an application of the present invention to the prior art "source output" type output circuit 101 shown in FIG. 5(A). Since the basic configuration and the operations of the output circuit 11 are the same as those of the output circuit 101 shown in FIG. 5(A), the description thereof will be omitted and only the configuration and the operations of the output circuit 11 different from those of the output circuit 101 shown in FIG. 5(A) will be described.

Referring to FIG. 2, the output circuit 11 in the second embodiment comprises, in addition to the components of the output circuit 101 shown in FIG. 5(A), a pnp transistor 13 (hereinafter referred to as "second transistor 13") having a collector connected to the gate of the FET 105, and an emitter connected to the source of the FET 105, a resistor 15 having one end connected to the base of the second transistor 13, a capacitor 17 having one terminal connected to the other end of the resistor 15 and the other terminal connected to the drain of the FET 105, and a resistor 19 connected across the base and the emitter of the second transistor 13.

In the output circuit 11 in the second embodiment, the photocoupler 109 and the resistor 107 correspond to the drive control means, the differentiation circuit comprising the capacitor 17 and the resistors 15 and 19 corresponds to the voltage application detecting means, and the second transistor 13 corresponds to the voltage control means. When the controlled device 103 is connected with the power supply VD turned on or when the power supply VD is turned on with the controlled device 103 connected, a sharply rising voltage is applied across the source and the drain of the FET 105. Then, as shown in FIG. 5(A), a charging current flows from the gate to the drain to charge the gate-drain junction capacitance Cgd and, at the same time, a current I3 flows through the differentiation circuit comprising the capacitor 17 and the resistors 15 and 19, and the current 13, i.e., a charging current for charging the capacitor 17, acts as part of a base current that turns on the second transistor 13. Therefore, current does not flow through the resistor 107 to the gate-drain junction capacitance Cgd, and the emitter-collector current I4 of the second transistor 13 flows to the gate-drain junction capacitance Cgd, so that the creation of potential difference is between the gate and the source of the FET 105.

As the capacitor 17 is charged and the emitter-collector current 14 decreases below a predetermined level, the second transistor 13 is turned on. By this time, the junction capacitance Cgd of the FET 105 has been fully charged. Thus, the output circuit 11 in the second embodiment avoids the flash-on of the FET 105 when the power supply is turned on simply by using the second transistor 13, the capacitor 17 and the resistors 15 and 19, and the second transistor 13 may be of a comparatively small current capacity regardless of the intensity of the current supplied to the output detector L.

The operation of switching the FET 105 from the ON to the OFF state when the output circuit 1 operating normally will be described below Specifically, the internal circuit 111 stops the light emitting operation of the LED 109b to stop driving phototransistor 109a. Then, the gate-source junction capacitance Cgs and the gate-drain junction capacitance Cgd of the FET 105 are discharged through the resistor 107. Upon the rise of the gate voltage of the FET 105 and the rise of the gate-source voltage to a predetermined OFF voltage, the FET 105 in the ON state starts changing to the OFF state, and then the drain-source voltage rises. Then, as mentioned above, a charging current flows to the gate-drain junction capacitance Cgd from the drain to the gate. At the same time, the current I3 flows through the differentiation circuit comprising the capacitor 17 and the resistors 15 and 19, and the second transistor 13 is turned on by the current I3. Therefore, any current which does not flow through the resistor 107 to the gate-drain junction capacitance Cgd and the emitter-collector current 14 of the second transistor 13 flows to the gate-drain junction capacitance Cgd, and the charge stored in the gate-source junction capacitance Cgs is charged rapidly through the second transistor 13, so that the FET 105 is turned off instantaneously. As the capacitor 17 is charged and the current I3 decreased below a predetermined level, the second transistor 13 is turned off. By this time, the junction capacitance Cgd of the FET 105 has been fully charged and the junction capacitance Cgs has been fully discharged. Accordingly, the output circuit 11 in the second embodiment reduces the OFF delay time of the FET 105. Additionally, the output circuit 11 in the second embodiment avoids the flash-on of the FET 105. Consequently, the speed of the switching operation can be enhanced and the switching loss can be reduced.

Figure 3:
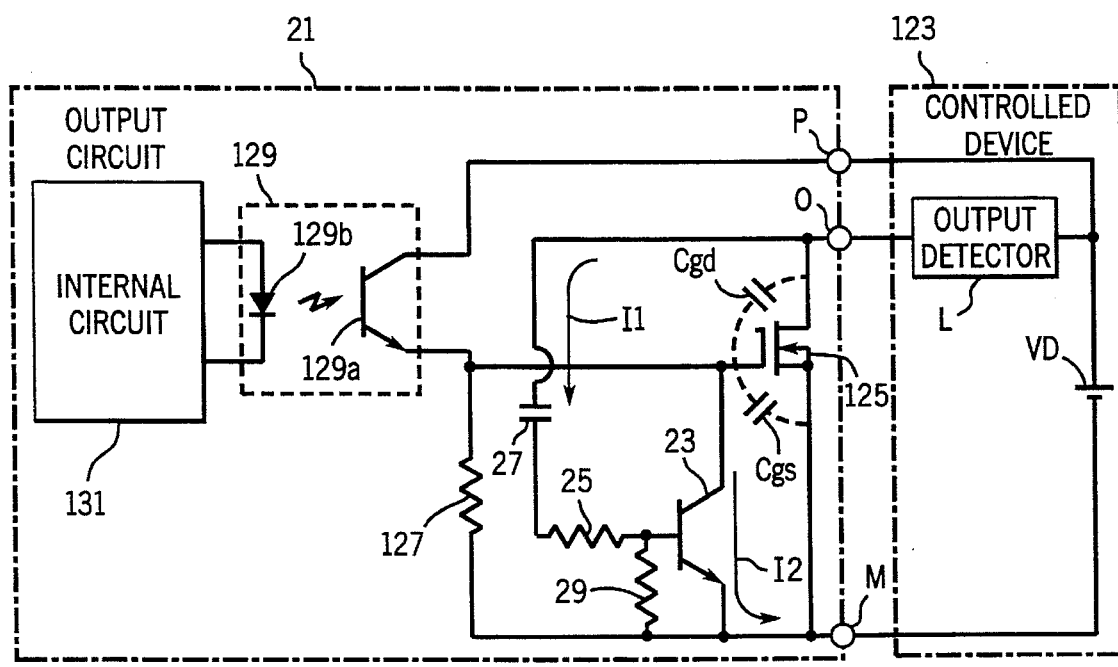
FIG. 3 is a circuit diagram of an output device in a third embodiment according to the present invention.
Figure 5B:
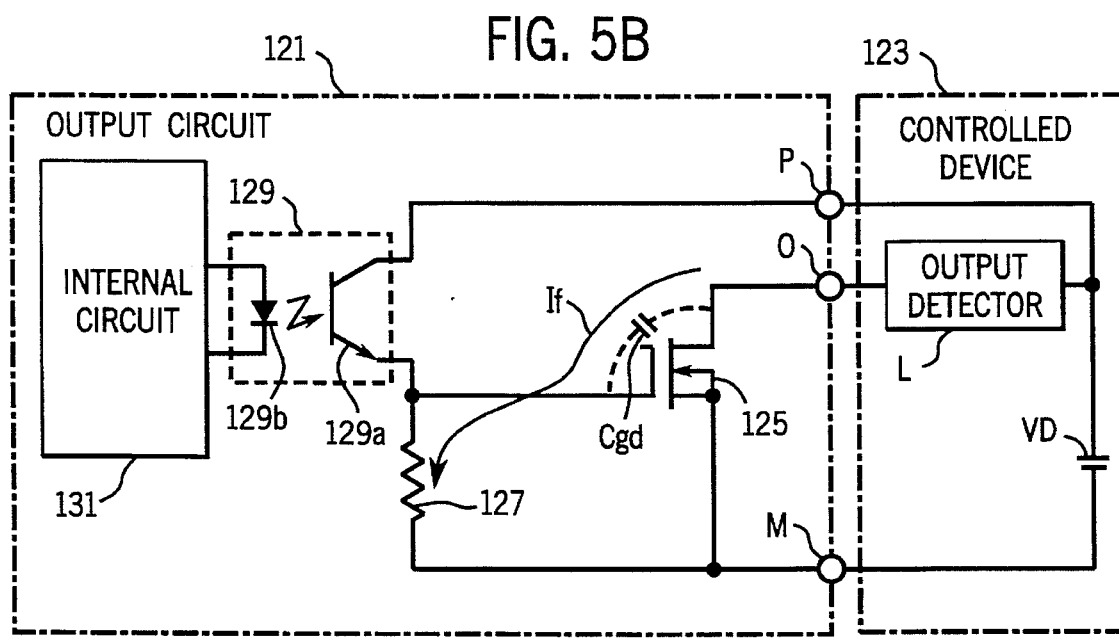

FIG. 3 is a circuit diagram of an output circuit 21 included in a programmable controller in a third embodiment according to the present invention, in which parts like or corresponding to those shown in FIG. 5(b) are designated by the same reference characters. This output circuit 21 is an application of the present invention to the prior art sink output type output circuit 121 shown in FIG. 5(B). Since the basic configuration and the operations of the output circuit 21 are the same as those of the output circuit 121 shown in FIG. 5(B), the description thereof will be omitted and only the configuration and the functions of the output circuit 11 different from those of the output circuit 121 shown in FIG. 5(B) will be described.

Referring to FIG. 3, the output circuit 21 in the third embodiment comprises, in addition to the components of the output circuit 121 shown in FIG. 5(B), a npn transistor 23 (hereinafter referred to as "second transistor 23") having a collector connected to the gate of the FET 125, and an emitter connected to the source of the FET 125, a resistor 25 having one end connected to the base of the second transistor 23, a capacitor 27 having one terminal connected to the other end of the resistor 25 and the other terminal connected to the drain of the FET 125, and a resistor 29 connected across the base and the emitter of the second transistor 23.

In the output circuit 31 of the third embodiment, the photocoupler 129 and the resistor 127 correspond to the drive control means, the differentiation circuit comprising the capacitor 27 and the resistors 25 and 29 corresponds to the voltage application detecting means, and the second transistor 23 corresponds to the voltage control means.

The operations of the output circuit 21 thus constructed are the same as those of the output circuit 1 in the first embodiment, except that the internal circuit 131 drives the FET 125 by the photocoupler 129 (and the resistor 127) in the output circuit 21. The output circuit 21 in the third embodiment avoids the flash-on of the FET 145 and reduces the OFF delay time by the simple circuit comprising the second transistor 23, the capacitor 27 and the resistors 25 and 29.

In each of the output circuits 1, 11 and 21 in the foregoing embodiments, the differentiation circuit comprising the capacitor and the resistors connected in series is connected across the drain and the source of each of the FETs 145, 105 and 125, and flash-on is avoided and OFF delay time is reduced by turning on each of the second transistors 3, 13 and 23 by the charging current that is supplied to the capacitor of the differentiation circuit.

Figure 4A:
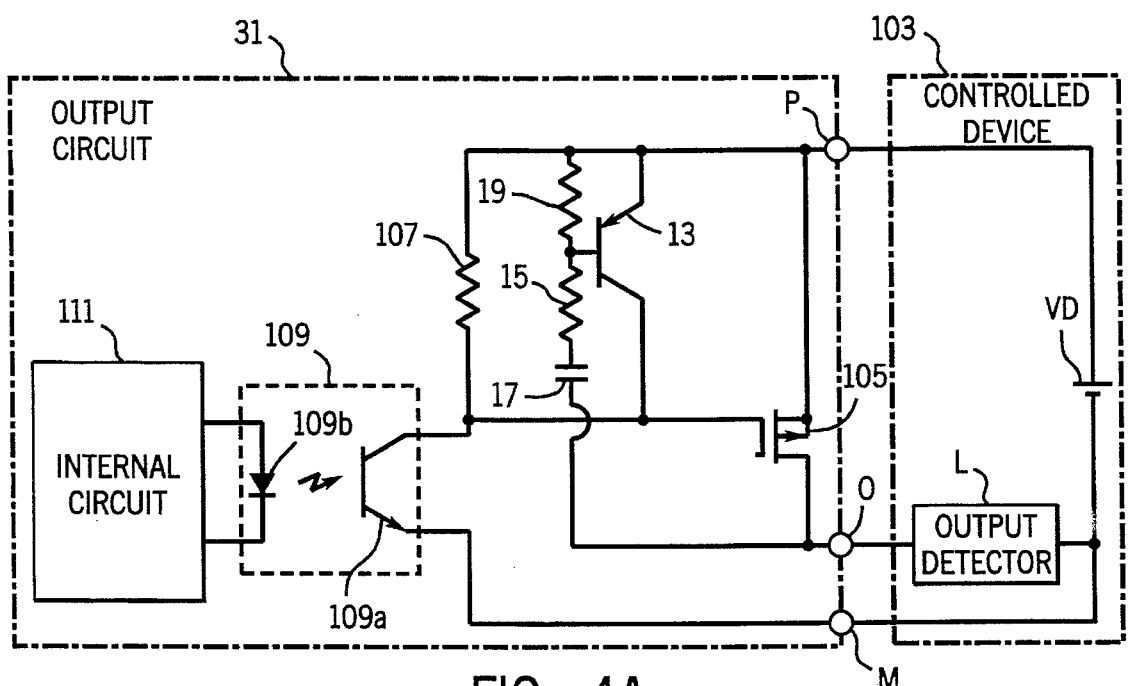
FIG. 4 is a circuit diagram of an output device in a further embodiment according to the present invention.
Figure 4B:
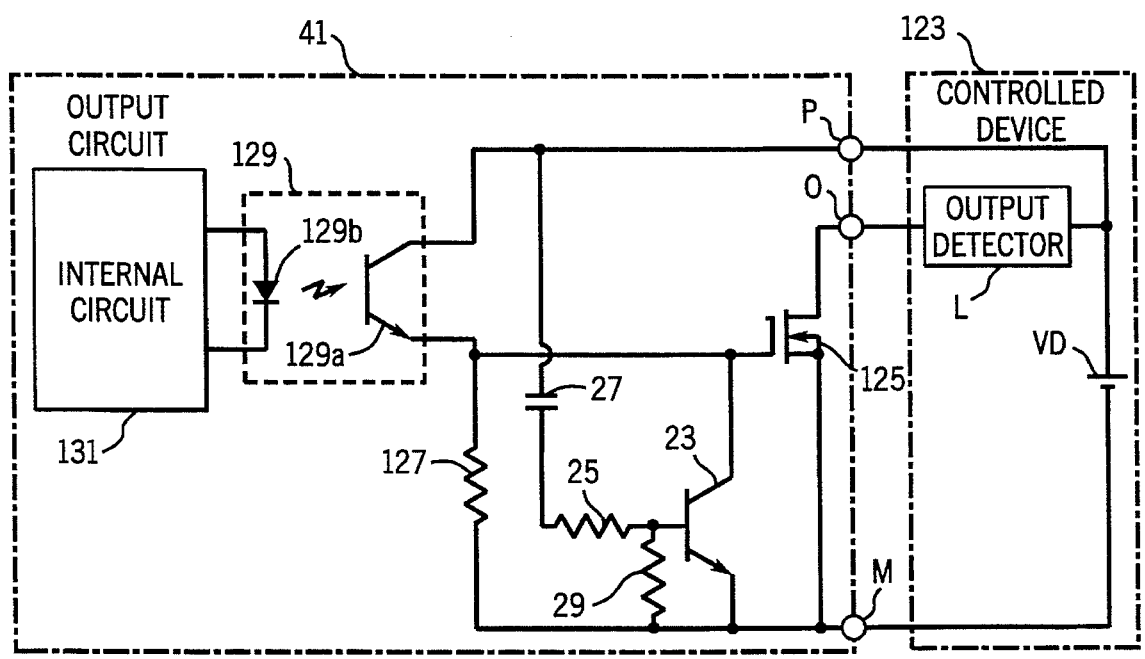

An output circuit similar to the output circuit 11 in the second embodiment or the output circuit 21 in the third embodiment drives the FET 105 or 125 for switching operation by the supply voltage of the power supply VD included in the driven device 103 or 123, the second transistor 13 or 23 may be turned on upon the detection of the leading edge of the supply voltage of the power supply VD as shown in FIGS. 4(A) and 4(B).

Output circuit 31 shown in FIG. 4(A), differs from the output circuit 11 in the second embodiment in that the terminal of the capacitor 17 opposite the terminal of the same connected to the resistor 15 is connected to the terminal M on the side of the negative terminal of the power supply VD instead of to the drain of the FET 105. Output circuit 41 shown in FIG. 4(B), differs from the output circuit 21 in the third embodiment, in that the terminal of the capacitor 27 opposite the terminal of the same connected to the resistor 25 is connected to the terminal P on the side of the positive terminal of the power supply VD instead of to the drain of the FET 125.

In the output circuits 31 and 41 shown in FIGS. 4(A) and 4(B), a current flows through the differentiation circuit comprising the capacitor 17 and the resistors 15 and 19, and a current flows through the differentiation circuit comprising the capacitor 27 and the resistors 25 and 29 for a predetermined time when the power supply VD is turned on to turn on the second transistors 13 and 23, respectively, so that the flash-on of the FETs 105 and 125 can be avoided. Although the output circuits 1, 11, 21, 31 and 41 in the foregoing embodiments switch the output detector L by the FET, a bipolar transistor or an IGBT may be employed therein instead of the FET. Furthermore, although the output circuit in each of the foregoing embodiments detects the variation of the rising voltage by the differentiation circuit comprising the capacitor and the resistors to form the output circuit in a simple configuration, the second transistors 3, 13 and 23 may be turned on by a pulse signal provided by a one-shot circuit comprising a logic circuit and provides a pulse signal of a predetermined pulse width when the rise of the voltage varies.

FETs and IGBTs may be used instead of the bipolar transistors serving as the second transistors 3, 13 and 23 for forcibly turning of the FETs 105, 125 and 145. Although the switching device of the invention has been described as applied to the output circuit of the programmable controller, the present invention is applicable also to a driving circuit for turning on and off various kinds of loads, such as a lamp and solenoid.

We claim:

1. A switching device comprising: a transistor having a collector and an emitter, or a drain and a source connected, respectively, with two output terminals connected in series to a current line for supplying a current from a power supply to a predetermined load; and and a drive control means for controlling the switching operation of the transistor by supplying a current or applying a voltage to a driving terminal connected to the base or the gate of the transistor to control the supply of current to the load;

characterized by:

a voltage application detecting means for detecting whether the supply voltage of the power supply is applied through the load across the two output terminals of the transistor; and a voltage control means for forcibly holding the voltage applied to the driving terminal on a voltage level at which the transistor is turned off for a predetermined time when the voltage application detecting means detects the application of the supply voltage of the power supply across the two output terminals of the transistor.

2. The switching device according to claim 1, wherein the drive control means receives the supply voltage of the power supply to drive the transistor for switching operation, the voltage application detecting means decides that the supply voltage is applied to the two output terminals of the transistor upon the detection of the leading edge of a voltage applied to the drive control means.

3. The switching device according to claim 1, wherein the voltage application detecting means senses that the supply voltage is applied to the two output terminals of the transistor upon the detection of the leading edge of the supply voltage applied across the two output terminals of the transistor.

4. The switching device according to claim 2, wherein the voltage application detecting means is a differentiation circuit comprising a capacitor and resistors connected in series to the capacitor, and the voltage control means is a second transistor that connects the driving terminal of the transistor to the output terminal connected to the emitter or the source when a charging current for charging the capacitor is equal to or higher than a predetermined level.

5. The switching device according to claim 3, wherein the voltage application detecting means is a differentiation circuit comprising a capacitor and resistors connected in series to the capacitor, and the voltage control means is a second transistor that connects the driving terminal of the transistor to the output terminal connected to the emitter or the source when a charging current for charging the capacitor is equal to or higher than a predetermined level.

* * * * *